United States Patent
Frye et al.

(10) Patent No.: US 10,731,109 B2
(45) Date of Patent: Aug. 4, 2020

(54) POST CHEMICAL MECHANICAL POLISHING FORMULATIONS AND METHOD OF USE

(71) Applicant: Entegris, Inc., Billerica, MA (US)

(72) Inventors: Donald Frye, Sherman, CT (US); Jun Liu, Brookfield, CT (US); Daniela White, Ridgefield, CT (US); Michael White, Ridgefield, CT (US)

(73) Assignee: ENTEGRIS, INC., Billerica, MA (US)

( * ) Notice: Subject to any disclaimer, the term of this patent is extended or adjusted under 35 U.S.C. 154(b) by 113 days.

(21) Appl. No.: 15/951,023

(22) Filed: Apr. 11, 2018

(65) Prior Publication Data

US 2018/0291309 A1 Oct. 11, 2018

Related U.S. Application Data

(60) Provisional application No. 62/484,168, filed on Apr. 11, 2017.

(51) Int. Cl.

| | | |
|---|---|---|
| *C11D 3/30* | (2006.01) | |
| *C11D 3/00* | (2006.01) | |
| *C11D 11/00* | (2006.01) | |
| *C11D 3/33* | (2006.01) | |
| *C11D 3/20* | (2006.01) | |
| *C11D 3/36* | (2006.01) | |
| *H01L 21/02* | (2006.01) | |
| *C11D 3/04* | (2006.01) | |
| *C11D 3/28* | (2006.01) | |

(52) U.S. Cl.
CPC .......... *C11D 3/0073* (2013.01); *C11D 3/0047* (2013.01); *C11D 3/044* (2013.01); *C11D 3/2068* (2013.01); *C11D 3/2082* (2013.01); *C11D 3/28* (2013.01); *C11D 3/30* (2013.01); *C11D 3/33* (2013.01); *C11D 3/361* (2013.01); *C11D 11/0047* (2013.01); *H01L 21/02074* (2013.01)

(58) Field of Classification Search
CPC .................................................. C11D 11/0047
USPC .......................................................... 510/175
See application file for complete search history.

(56) References Cited

U.S. PATENT DOCUMENTS

| | | | |
|---|---|---|---|
| 2001/0004633 A1 | 6/2001 | Naghshineh et al. | |
| 2003/0228990 A1 | 12/2003 | Lee et al. | |
| 2012/0283163 A1* | 11/2012 | Barnes | C11D 1/72 510/175 |
| 2014/0264151 A1* | 9/2014 | Ko | H01L 21/02074 252/79.1 |
| 2016/0075971 A1* | 3/2016 | Liu | C23G 1/18 510/175 |
| 2016/0130500 A1* | 5/2016 | Chen | C11D 3/30 216/13 |
| 2016/0340620 A1* | 11/2016 | Sun | C23G 1/20 |

FOREIGN PATENT DOCUMENTS

| | | |
|---|---|---|
| EP | 2 281 867 A1 | 2/2011 |
| EP | 2 863 415 A1 | 4/2015 |
| TW | 201634683 A | 10/2016 |
| WO | 2016/111990 A1 | 7/2016 |

* cited by examiner

*Primary Examiner* — Gregory E Webb
(74) *Attorney, Agent, or Firm* — Entegris, Inc.

(57) ABSTRACT

A cleaning composition and process for cleaning post-chemical mechanical polishing (CMP) residue and contaminants from a microelectronic device having said residue and contaminants thereon. The composition achieves highly efficacious cleaning of the post-CMP residue and contaminant material from the surface of the microelectronic device without compromising the low-k dielectric material or the copper interconnect material. In addition, the cleaning compositions are compatible with ruthenium-containing materials.

19 Claims, No Drawings

POST CHEMICAL MECHANICAL POLISHING FORMULATIONS AND METHOD OF USE

CROSS-REFERENCE TO RELATED APPLICATIONS

This application claims the benefit under 35 USC 119 of U.S. Provisional Patent Application No. 62/484,168, filed Apr. 11, 2017, the disclosure of which is hereby incorporated herein by reference in its entirety for all purposes.

FIELD

The present invention relates generally to compositions for cleaning residue and/or contaminants from microelectronic devices having same thereon, and in particular residue and/or contaminants that comprises at least one of copper-containing material, tantalum-containing material, cobalt-containing material, and ruthenium-containing material.

DESCRIPTION OF THE RELATED ART

Microelectronic device wafers are used to form integrated circuits. The microelectronic device wafer includes a substrate, such as silicon, into which regions are patterned for deposition of different materials having insulative, conductive or semi-conductive properties.

In order to obtain the correct patterning, excess material used in forming the layers on the substrate must be removed. Further, to fabricate functional and reliable circuitry, it is often important to prepare a flat or planar microelectronic wafer surface prior to subsequent processing. Thus, it is necessary to planarize and/or polish certain surfaces of a microelectronic device wafer.

Chemical Mechanical Polishing or Planarization ("CMP") is a process in which material is removed from a surface of a microelectronic device wafer, and the surface is planarized and polished by coupling a physical process such as abrasion with a chemical process such as oxidation or chelation. In its most rudimentary form, CMP involves applying slurry, e.g., a solution of an abrasive and an active chemistry, to a polishing pad that buffs the surface of a microelectronic device wafer to achieve the removal, planarization, and polishing processes. It is not typically desirable for the removal or polishing process to be comprised of purely physical or purely chemical action, but rather the synergistic combination of both in order to achieve fast, uniform removal. In the fabrication of integrated circuits, the CMP slurry should also be able to preferentially remove films that comprise complex layers of metals and other materials so that highly planar surfaces can be produced for subsequent photolithography, patterning, etching and thin-film processing.

In copper damascene processes commonly used for metallization of circuitry in microelectronic device fabrication, the layers that must be removed and planarized include copper layers having a thickness of about 1-1.5 µm and copper seed layers having a thickness of about 0.05-0.15 µm. These copper layers are separated from the dielectric material surface by a layer of barrier material, typically about 50-300 Å thick, which prevents diffusion of copper into the oxide dielectric material. One key to obtaining good uniformity across the wafer surface after polishing is to use a CMP slurry that has the correct removal selectivities for each material.

Tantalum and tantalum nitride are currently used as barrier layer material to prevent device contamination caused by copper diffusing through the dielectric layer. However, it is difficult to deposit copper effectively onto the barrier layer due to the high resistivity of tantalum, especially in high-aspect ratio features. Consequently, a copper seed layer has to be initially deposited onto the barrier layer. As the feature size of the circuits are being reduced to the 65 nm, 45 nm and 32 nm scale, controlling the precise thickness of the seed layer to prevent overhang at the top of the trenches and the formation of voids becomes extremely difficult especially for 32 nm technology node and beyond.

The foregoing processing operations, involving wafer substrate surface preparation, deposition, plating, etching and chemical mechanical polishing, variously require cleaning operations to ensure that the microelectronic device product is free of residue and contaminants that would otherwise deleteriously affect the function of the product, or even render it useless for its intended function. Often, particles of these contaminants are smaller than 0.3 µm. Following CMP processing, such residues and contaminants include CMP slurry components, particles from the removed layers, and corrosion inhibitor compounds such as benzotriazole (BTA). If not removed, these residues can cause damage to copper lines or severely roughen the copper metallization, as well as cause poor adhesion of post-CMP applied layers on the device substrate. Severe roughening of copper metallization is particularly problematic, since overly rough copper can cause poor electrical performance of the product microelectronic device.

There is a continuing need in the art to provide compositions and methods that effectively remove residues and contaminants from a substrate, including substrates that include barrier materials other than, or in addition, tantalum and tantalum nitride. The compositions and methods should eliminate particles and other defectivities on the copper as well as not corrode, or otherwise damage the copper.

SUMMARY

The present invention generally relates to a composition and process for cleaning residue and/or contaminants from microelectronic devices having said residue and contaminants thereon. The residue may include post-CMP, post-etch, and/or post-ash residue. The compositions and methods are particularly advantageous when cleaning a microelectronic surface comprising copper, low-k dielectric materials, and barrier materials comprising at least one of tantalum-containing material, cobalt-containing material, and ruthenium-containing material.

In one aspect, a cleaning composition is described, said cleaning composition comprising at least one organic amine, water, at least one pH adjusting agent, at least one organic additive, and at least one metal corrosion inhibitor.

In another aspect, a method of removing residue and contaminants from a microelectronic device having said residue and contaminants thereon, said method comprising contacting the microelectronic device with a cleaning composition for sufficient time to at least partially clean said residue and contaminants from the microelectronic device, wherein the cleaning composition is compatible with copper, low-k dielectric materials, and barrier materials, wherein the barrier materials comprise at least one of tantalum-containing material, cobalt-containing material, and ruthenium-containing material, and wherein the cleaning composition comprises at least one organic amine, water, at least one pH adjusting agent, at least one organic additive, and at least one metal corrosion inhibitor.

Other aspects, features and advantages will be more fully apparent from the ensuing disclosure and appended claims.

DETAILED DESCRIPTION, AND PREFERRED EMBODIMENTS THEREOF

The present invention relates generally to compositions useful for the removal of residue and contaminants from a microelectronic device having such material(s) thereon. The compositions are particularly useful for the removal of post-CMP, post-etch or post-ash residue.

For ease of reference, "microelectronic device" corresponds to semiconductor substrates, flat panel displays, phase change memory devices, solar panels and other products including solar substrates, photovoltaics, and microelectromechanical systems (MEMS), manufactured for use in microelectronic, integrated circuit, or computer chip applications. Solar substrates include, but are not limited to, silicon, amorphous silicon, polycrystalline silicon, monocrystalline silicon, CdTe, copper indium selenide, copper indium sulfide, and gallium arsenide on gallium. The solar substrates may be doped or undoped. It is to be understood that the term "microelectronic device" is not meant to be limiting in any way and includes any substrate that will eventually become a microelectronic device or microelectronic assembly.

As used herein, "residue" corresponds to particles generated during the manufacture of a microelectronic device including, but not limited to, plasma etching, ashing, chemical mechanical polishing, wet etching, and combinations thereof.

As used herein, "contaminants" correspond to chemicals present in the CMP slurry, reaction by-products of the polishing slurry, chemicals present in the wet etching composition, reaction by products of the wet etching composition, and any other materials that are the by-products of the CMP process, the wet etching, the plasma etching or the plasma ashing process. A common contaminant includes benzotriazole, which is often present in the CMP slurry.

As used herein, "post-CMP residue" corresponds to particles from the polishing slurry, e.g., silica-containing particles, chemicals present in the slurry, reaction by-products of the polishing slurry, carbon-rich particles, polishing pad particles, brush deloading particles, equipment materials of construction particles, metals, metal oxides, organic residues, barrier layer residues, and any other materials that are the by-products of the CMP process. As defined herein, the "metals" that are typically polished include copper, aluminum and tungsten.

As defined herein, "low-k dielectric material" corresponds to any material used as a dielectric material in a layered microelectronic device, wherein the material has a dielectric constant less than about 3.5. Preferably, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. It is to be appreciated that the low-k dielectric materials may have varying densities and varying porosities.

As defined herein, "complexing agent" includes those compounds that are understood by one skilled in the art to be complexing agents, chelating agents and/or sequestering agents. Complexing agents will chemically combine with or physically hold the metal atom and/or metal ion to be removed using the compositions described herein.

As defined herein, the term "barrier material" corresponds to any material used in the art to seal the metal lines, e.g., copper interconnects, to minimize the diffusion of said metal, e.g., copper, into the dielectric material. Preferred barrier layer materials include tantalum, titanium, ruthenium, hafnium, tungsten, cobalt, and nitrides and silicides of any of the foregoing metals.

As defined herein, "post-etch residue" corresponds to material remaining following gas-phase plasma etching processes, e.g., BEOL dual damascene processing, or wet etching processes. The post-etch residue may be organic, organometallic, organosilicic, or inorganic in nature, for example, silicon-containing material, carbon-based organic material, and etch gas residue such as oxygen and fluorine.

As defined herein, "post-ash residue," as used herein, corresponds to material remaining following oxidative or reductive plasma ashing to remove hardened photoresist and/or bottom anti-reflective coating (BARC) materials. The post-ash residue may be organic, organometallic, organosilicic, or inorganic in nature.

"Substantially devoid" is defined herein as less than 2 wt. %, preferably less than 1 wt. %, more preferably less than 0.5 wt. %, and most preferably less than 0.1 wt. %. In one embodiment, "substantially devoid" corresponds to zero percent.

As defined herein, "ruthenium-containing material" and "ruthenium species" includes, but is not limited to, pure ruthenium, ruthenium nitrides (including ruthenium nitrides comprising additional elements such as Si, Ta or Li), ruthenium oxides (including ruthenium oxides comprising hydroxides), and ruthenium alloys. It should be understood by the person skilled in the art that the chemical formula for the various ruthenium oxides and nitrides can vary based on the oxidation state of the ruthenium ion, wherein the common oxidation states of ruthenium are 0, +2, +3, +4, +6, +7, +8 or −2.

As defined herein, "tantalum-containing material" and "tantalum species" includes, but is not limited to, pure tantalum, tantalum nitrides (including tantalum nitrides comprising additional elements such as Si), tantalum oxides (including tantalum oxides comprising hydroxides), tantalum aluminides, and tantalum alloys. It should be understood by the person skilled in the art that the chemical formula for the various tantalum oxides and nitrides can vary based on the oxidation state of the tantalum ion, wherein the common oxidation states of tantalum are −1, −3, +1, +2, +3, +4 and +5.

As defined herein, "cobalt-containing material" and "cobalt species" includes, but is not limited to, pure cobalt, cobalt oxide, cobalt hydroxide, (including cobalt nitrides comprising additional elements such as Ta or Ti), tantalum oxides, CoW, CoP, CoSi, and cobalt silicide. It should be understood by the person skilled in the art that the chemical formula for the various cobalt oxides and nitrides can vary based on the oxidation state of the cobalt ion, wherein the common oxidation states of cobalt are −3, −1, +1, +2, +3, +4, +5.

As defined herein, "ruthenium-containing material" and "ruthenium species" includes, but is not limited to, pure ruthenium, ruthenium nitrides (including ruthenium nitrides comprising additional elements such as Si, Ta or Li), ruthenium oxides (including ruthenium oxides comprising hydroxides), and ruthenium alloys. It should be understood by the person skilled in the art that the chemical formula for the various ruthenium oxides and nitrides can vary based on the oxidation state of the ruthenium ion, wherein the common oxidation states of ruthenium are 0, +2, +3, +4, +6, +7, +8 or −2.

As used herein, "about" is intended to correspond to ±5% of the stated value.

As defined herein, "reaction or degradation products" include, but are not limited to, product(s) or byproduct(s) formed as a result of catalysis at a surface, oxidation, reduction, reactions with the compositional components, or that otherwise polymerize; product(s) or byproduct(s) formed as a result of a change(s) or transformation(s) in which a substance or material (e.g., molecules, compounds, etc.) combines with other substances or materials, interchanges constituents with other substances or materials, decomposes, rearranges, or is otherwise chemically and/or physically altered, including intermediate product(s) or byproduct(s) of any of the foregoing or any combination of the foregoing reaction(s), change(s) and/or transformation(s). It should be appreciated that the reaction or degradation products may have a larger or smaller molar mass than the original reactant.

"Oxidizing agents" are well known in the chemical arts as species that can oxidize another species while itself being reduced. For the purposes of the present application, oxidizing agents can include, but are not limited to, ozone, nitric acid, bubbled air, cyclohexylaminosulfonic acid, hydrogen peroxide, $FeCl_3$, oxone, perborate salts, perchlorate salts, periodate salts, persulfate salts, permanganate salts, chlorite salts, chlorate salts, iodate salts, hypohlorite salts, nitrate salts, peroxomonosulfate salts, peroxomonosulfuric acid, ferric nitrate, amine-N-oxides, urea hydrogen peroxide, peracetic acid, periodic acid, potassium dichromate, 2-nitrophenol, 1,4-benzoquinone, peroxybenzoic acid, peroxyphthalic acid salts, vanadium oxides, ammonium metavanadate, ammonium tungstate, sulfuric acid, and combinations thereof.

"Azole-containing corrosion inhibitors" or "azole-containing passivating agents include triazoles and derivatives thereof, benzotriazoles and derivatives thereof, tolyltriazole, thiazoles and derivatives thereof, tetrazoles and derivatives thereof, imidazoles and derivatives thereof, and azines and derivatives thereof.

As used herein, "fluoride containing compounds" correspond to salt or acid compound comprising a fluoride ion ($F^−$) that is ionically bonded to another atom.

As used herein, "suitability" for cleaning residue and contaminants from a microelectronic device having said residue and contaminants thereon corresponds to at least partial removal of said residue/contaminants from the microelectronic device. Cleaning efficacy is rated by the reduction of objects on the microelectronic device. For example, pre- and post-cleaning analysis may be carried out using an atomic force microscope. The particles on the sample may be registered as a range of pixels. A histogram (e.g., a Sigma Scan Pro) may be applied to filter the pixels in a certain intensity, e.g., 231-235, and the number of particles counted. The particle reduction may be calculated using:

$$\text{Cleaning Efficacy} = \frac{\left(\begin{array}{c}\text{Number of } PreClean \text{ Objects} - \\ \text{Number of } PostClean \text{ Objects}\end{array}\right)}{\text{Number of } PreClean \text{ Objects}} \times 100$$

Notably, the method of determination of cleaning efficacy is provided for example only and is not intended to be limited to same. Alternatively, the cleaning efficacy may be considered as a percentage of the total surface that is covered by particulate matter. For example, AFM's may be programmed to perform a z-plane scan to identify topographic areas of interest above a certain height threshold and then calculate the area of the total surface covered by said areas of interest. One skilled in the art would readily understand that the less area covered by said areas of interest post-cleaning, the more efficacious the cleaning composition. Preferably, at least 75% of the residue/contaminants are removed from the microelectronic device using the compositions described herein, more preferably at least 90%, even more preferably at least 95%, and most preferably at least 99% of the residue/contaminants are removed.

Compositions described herein may be embodied in a wide variety of specific formulations, as hereinafter more fully described.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.001 weight percent, based on the total weight of the composition in which such components are employed.

In a first aspect, the cleaning compositions comprise, consist of, or consist essentially of at least one organic amine, water, at least one pH adjusting agent, at least one organic additive, and at least one metal corrosion inhibitor. In one embodiment, the cleaning compositions comprise, consist of, or consist essentially of at least one organic amine, water, at least two pH adjusting agents, at least one organic additive, and at least one metal corrosion inhibitor. In another embodiment, the cleaning compositions comprise, consist of, or consist essentially of at least one organic amine, water, at least one pH adjusting agent, at least two organic additives, and at least one metal corrosion inhibitor. In still another embodiment, the cleaning compositions comprise, consist of, or consist essentially of at least one organic amine, water, at least one pH adjusting agent, at least one organic additive, and at least two metal corrosion inhibitors. In another embodiment, the cleaning compositions comprise, consist of, or consist essentially of at least one organic amine, water, at least two pH adjusting agents, at least two organic additives, and at least one metal corrosion inhibitor. In yet another embodiment, the cleaning compositions comprise, consist of, or consist essentially of at least one organic amine, water, at least two pH adjusting agents, at least one organic additive, and at least two metal corrosion inhibitors. In still another embodiment, the cleaning compositions comprise, consist of, or consist essentially of at least one organic amine, water, at least one pH adjusting agent, at least two organic additives, and at least two metal corrosion inhibitors. In yet another embodiment, the cleaning compositions comprise, consist of, or consist essentially of at least one organic amine, water, at least two pH adjusting agents, at least two organic additives, and at least two metal corrosion inhibitors. Any of the embodiments can further include at least one reducing agent, at least one buffering agent, or both at least one reducing agent and at least one buffering agent. Further, any of the embodiments disclosed herein can further include at least one surfactant. Advantageously, the cleaning composition increases the removal of contaminants such as benzotriazole while simultaneously lowering the corrosion rate of exposed copper and the amount of residue (e.g., post-CMP residue, including post-CMP residue that comprises barrier layer materials comprising at least one of tantalum species, cobalt species, and ruthenium species) remaining on the exposed copper.

The cleaning compositions of the first aspect can be substantially devoid, or devoid, of at least one oxidizing agent; fluoride-containing sources; abrasive materials; tetramethylammonium hydroxide; azole-containing corrosion inhibitors; gallic acid; sulfonium compounds; amidoxime compounds; and combinations thereof, prior to removal of residue material from the microelectronic device. In addition, the cleaning compositions should not solidify to form a polymeric solid, for example, photoresist. Although it is contemplated that the formulations can include at least one surfactant, it is also contemplated that the formulations be substantially devoid of surfactants, as readily understood by the person skilled in the art. Further, the amount of at least one organic additive in the cleaning composition, based on the total weight of the composition, is less than 20 wt %, preferably less than 10 wt %, and more preferably less than 5 wt %, and the at least one pH adjusting agent preferably comprises an alkali hydroxide, e.g., KOH.

In one preferred embodiment, the cleaning composition of the first aspect comprises, consists of or consists essentially of at least one organic amine, water, at least one pH adjusting agent, at least one organic additive, and at least one metal corrosion inhibitor, wherein the cleaning composition is formulated in the following weight percent ratios: organic amine(s)/metal corrosion inhibitor(s) in a range from about 1 to about 100, preferably about 5 to about 50, more preferably about 10 to about 25, and most preferably about 12 to about 20; pH adjusting agent(s)/metal corrosion inhibitor(s) in a range from about 0.1 to about 50, preferably about 1 to about 30, more preferably about 2 to about 20, and most preferably about 4 to about 10; and organic additive(s)/metal corrosion inhibitor(s) in a range from about 0.01 to about 50, preferably about 0.1 to about 25, more preferably about 1 to about 15, and most preferably about 2 to about 10. The amount of pH adjusting agent(s) added is dependent on the desired pH, as disclosed herein and as understood by the person skilled in the art. The amount of water in the cleaning composition, based on the total weight of the composition, is at least 80 wt %, preferably at least 85 wt %, and more preferably at least 90 wt %. The cleaning composition may further comprise at least one reducing agent, at least one buffering agent, or both at least one reducing agent and at least one buffering agent.

Illustrative organic amines that may be useful in specific compositions include species having the general formula $NR'R^2R^3$, wherein $R'$, $R^2$ and $R^3$ may be the same as or different from one another and are selected from the group consisting of hydrogen, straight-chained or branched $C_1$-$C_6$ alkyl (e.g., methyl, ethyl, propyl, butyl, pentyl, and hexyl), straight-chained or branched $C_1$-$C_6$ alcohol (e.g., methanol, ethanol, propanol, butanol, pentanol, and hexanol), and straight chained or branched ethers having the formula $R^4$—O—$R^5$, where $R^4$ and $R^5$ may be the same as or different from one another and are selected from the group consisting of $C_1$-$C_6$ alkyls as defined above. When the amine includes the ether component, the amine may be considered an alkoxyamine. Other organic amines contemplated include dicyanamide ($C_2N_3^-$), as well as salts and analogs thereof. Most preferably, at least one of $R^1$, $R^2$ and $R^3$ is a straight-chained or branched $C_1$-$C_6$ alcohol. Examples include, without limitation, alkanolamines such as alkanolamines such as aminoethylethanolamine, N-methylaminoethanol, aminoethoxyethanol, aminoethoxyethoxyethanol, butoxypropylamine, methoxypropylamine, butoxyisopropylamine, 2-ethylhexylisopropoxyamine, ethanolpropylamine, ethylethanolamine, n-hydroxyethylmorpholine, aminopropyldiethanolamine, dimethylaminoethoxyethanol, diethanolamine, N-methyldiethanolamine, monoethanolamine, triethanolamine, 1-amino-2-propanol, 3-amino-1-propanol, diisopropylamine, aminomethylpropanediol, N,N-dimethylaminomethylpropanediol, aminoethylpropanediol, N,N-dimethylaminoethylpropanediol, isopropyl amine, 2-amino-1-butanol, aminomethylpropanol, aminodimethylpropanol, N,N-dimethylaminomethylpropanol, isobutanolamine, diisopropanolamine, 3-amino,4-hydroxyoctane, 2-(TRIS), aminobutylanol, tris(hydroxymethyl)aminomethane N,N-dimethyltris(hydroxymethyl)aminomethane, hydroxyproplyamine, benzylamine, hydroxyethyl amine, tris(hydroxyethyl)aminomethane, other $C_1$-$C_8$ alkanolamines, and combinations thereof; amines such as triethylenediamine, ethylenediamine, hexamethylenediamine, tetraethylenepentamine (TEPA), triethylenetetraamine, diethylenetriamine, triethylamine, trimethylamine, and combinations thereof; diglycolamine; morpholine; and combinations of amines and alkanolamines. Preferably, the organic amine comprises monoethanolamine.

pH adjusting agents include alkali metal hydroxides (e.g., LiOH, KOH, RbOH, CsOH), alkaline earth metal hydroxides (e.g., $Be(OH)_2$, $Mg(OH)_2$, $Ca(OH)_2$, $Sr(OH)_2$, $Ba(OH)_2$), and compounds having the formula $NR^1R^2R^3R^4OH$, wherein $R^1$, $R^2$, $R^3$ and $R^4$ may be the same as or different from one another and are selected from the group consisting of hydrogen, straight-chained or branched $C_2$-$C_6$ alkyl (e.g., ethyl, propyl, butyl, pentyl, and hexyl), $C_1$-$C_6$ alkoxy (e.g., methoxy, ethoxy, propoxy, butoxy, pentoxy, hexoxy), and substituted or unsubstituted $C_6$-$C_{10}$ aryl, e.g., benzyl, wherein $R^1$, $R^2$, $R^3$ and $R^4$ are not all methyl groups. Tetraalkylammonium hydroxides that are commercially available include tetraethylammonium hydroxide (TEAH), tetrapropylammonium hydroxide (TPAH), tetrabutylammonium hydroxide (TBAH), tributylmethylammonium hydroxide (TBMAH), benzyltrimethylammonium hydroxide (BTMAH), choline hydroxide, ethyltrimethylammonium hydroxide, tris(2-hydroxyethyl)methyl ammonium hydroxide, diethyldimethylammonium hydroxide, triethylmethylammonium hydroxide, trishydroxyethylmethyl Ammonium Hydroxide, and combinations thereof, may be used. Alternatively or in addition, the at least one quaternary base can be a compound of the formula $(PR^1R^2R^3R^4)$ OH, wherein $R^1$, $R^2$, $R^3$, and $R^4$ may be the same as or different from one another and are selected from the group consisting of hydrogen, straight-chained $C_1$-$C_6$ alkyl (e.g., methyl, ethyl, propyl, butyl, pentyl, hexyl), branched $C_1$-$C_6$ alkyl, $C_1$-$C_6$ alkoxy (e.g., methoxy, ethoxy, propoxy, butoxy, pentoxy, hexoxy), substituted $C_6$-$C_{10}$ aryl, unsubstituted $C_6$-$C_{10}$ aryl (e.g., benzyl), and any combination thereof, such as tetrabutylphosphonium hydroxide (TBPH), tetramethylphosphonium hydroxide, tetraethylphosphonium hydroxide, tetrapropylphosphonium hydroxide, benzyltriphenylphosphonium hydroxide, methyl triphenylphosphonium hydroxide, ethyl triphenylphosphonium hydroxide, N-propyl triphenylphosphonium hydroxide. In one embodiment, the pH adjusting agent comprises KOH. In another embodiment, the pH adjusting agent comprises choline hydroxide. In another embodiment, the pH adjusting agent comprises at least one alkali metal hydroxide and at least one additional hydroxide enumerated herein. In another embodiment, the pH adjusting agent comprises KOH and at least one additional hydroxide enumerated herein. In still another embodiment, the pH adjusting agent comprises KOH and choline hydroxide.

The metal corrosion inhibitors contemplated herein include, but are not limited to, acetic acid, acetone oxime, acrylic acid, adipic acid, alanine, arginine, asparagine, aspartic acid, betaine, dimethyl glyoxime, formic acid, fumaric acid, gluconic acid, glutamic acid, glutamine, glutaric acid, glyceric acid, glycerol, glycolic acid, glyoxylic acid, histidine, iminodiacetic acid, isophthalic acid, itaconic acid, lactic acid, leucine, lysine, maleic acid, maleic anhydride, malic acid, malonic acid, mandelic acid, 2,4-pentanedione, phenylacetic acid, phenylalanine, phthalic acid, proline, propionic acid, pyrocatecol, pyromellitic acid, quinic acid, serine, sorbitol, succinic acid, tartaric acid, terephthalic acid, trimellitic acid, trimeric acid, tyrosine, valine, xylitol, oxalic acid, tannic acid, picolinic acid,1,3-cyclopentanedione, catechol, pyrogallol, resorcinol, hydroquinone, cyanuric acid, barbituric acid, 1,2-dimethylbarbituric acid, pyruvic acid, propanethiol, benzohydroxamic acids, 2,5-dicarboxypyridine, 4-(2-hydroxyethyl)morpholine (HEM), N-aminoethylpiperazine (N-AEP), ethylenediaminetetraacetic acid (EDTA), 1,2-cyclohexanediamine-N,N,N',N'-tetraacetic acid (CDTA), N-(hydroxyethyl)-ethylenediaminetriacetic acid (HEdTA), iminodiacetic acid (IDA), 2-(hydroxyethyl) iminodiacetic acid (HIDA), nitrilotriacetic acid, thiourea, 1,1,3,3-tetramethylurea, urea, urea derivatives, glycine, cysteine, glutamic acid, isoleucine, methionine, piperadine, N-(2-aminoethyl) piperadine, pyrrolidine, threonine, tryptophan, salicylic acid, p-toluenesulfonic acid, salicylhyroxyamic, 5-sulfosalicylic acid, and combinations thereof. In a preferred embodiment, preferably the metal corrosion inhibitor comprises at least one of cysteine, oxalic acid, histidine, or any combination thereof. In another preferred embodiment, the metal corrosion inhibitor comprises cysteine and oxalic acid. In still another preferred embodiment, the metal corrosion inhibitor comprises cysteine, oxalic acid, and at least one additional metal corrosion inhibitor.

Organic additives contemplated include, but are not limited to, 2-pyrrolidinone, 1-(2-hydroxyethyl)-2-pyrrolidinone (HEP), glycerol, 1,4-butanediol, tetramethylene sulfone (sulfolane), dimethyl sulfone, ethylene glycol, propylene glycol, dipropylene glycol, tetraglyme, diglyme, a glycol ether (e.g., diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether (DEGBE), triethylene glycol monobutyl ether (TEGBE), ethylene glycol monohexyl ether (EGHE), diethylene glycol monohexyl ether (DEGHE), ethylene glycol phenyl ether, propylene glycol methyl ether, dipropylene glycol methyl ether (DPGME), tripropylene glycol methyl ether (TPGME), dipropylene glycol dimethyl ether, dipropylene glycol ethyl ether, propylene glycol n-propyl ether, dipropylene glycol n-propyl ether (DPGPE), tripropylene glycol n-propyl ether, propylene glycol n-butyl ether (DOWANOL PnB), dipropylene glycol n-butyl ether, tripropylene glycol n-butyl ether, propylene glycol phenyl ether (DOWANOL PPh)), and combinations thereof. Alternatively, or in addition to, the organic additive can include phosphonic acid and derivatives thereof such as 1-hydroxyethylidene-1,1-diphosphonic acid (HEDP), 1,5,9-triazacyclododecane-N,N',N"-tris(methylenephosphonic acid) (DOTRP), 1,4,7,10-tetraazacyclododecane-N,N',N",N'-tetrakis(methylenephosphonic acid) (DOTP), nitrilotris(methylene)triphosphonic acid, diethylenetriaminepenta(methylenephosphonic acid) (DETAP), aminotri(methylenephosphonic acid), bis(hexamethylene) triamine phosphonic acid, 1,4,7-triazacyclononane-N,N',N"-tris(methylenephosphonic acid (NOTP), salts thereof, and derivatives thereof. Alternatively, or in addition to, the organic additive can include hydroxypropylcellulose, hydroxyethylcellulose (HEC), carboxymethylcellulose. sodium carboxymethylcellulose (Na CMC), polyvinylpyrrolidone (PVP), any polymer made using the N-vinyl pyrrolidone monomer, polyacrylic acid esters and analogoues of polyacrylic acid esters, polyaminoacids (e.g., polyalanine, polyleucine, polyglycine), polyamidohydroxyurethanes, polylactones, polyacrylamide, Xanthan gum, chitosan, polyethylene oxide, polyvinyl alcohol (PVA), polyvinyl acetate, polyacrylic acid, polyethyleneimine (PEI), sugar alcohols such as sorbitol and xylitol, esters of anhydrosorbitols, secondary alcohol ethoxylates such as TERGITOL, and combinations thereof. In a preferred embodiment, the at least one organic additive comprises HEDP. In another preferred embodiment, the at least one organic additive comprises at least one glycol ether comprising triethylene glycol monobutyl ether or propylene glycol n-butyl ether or propylene glycol phenyl ether. In yet another preferred embodiment, the at least one organic additive comprises HEDP and at least one glycol ether comprising triethylene glycol monobutyl ether or propylene glycol n-butyl ether or propylene glycol phenyl ether. In still another preferred embodiment, the at least one organic additive comprises HEC or a combination of HEDP and HEC or a combination of HEC, HEDP, and at least one glycol ether comprising triethylene glycol monobutyl ether or propylene glycol n-butyl ether or propylene glycol phenyl ether or a combination of HEC and at least one glycol ether comprising triethylene glycol monobutyl ether or propylene glycol n-butyl ether or propylene glycol phenyl ether.

Reducing agents, when present, include, but are not limited to, ascorbic acid, L(+)-ascorbic acid, isoascorbic acid, ascorbic acid derivatives, gallic acid, formamidinesulfinic acid, uric acid, tartaric acid, cysteine, potassium D-gluconate, hydroxylamine, potassium nitrite, guanidine carbonate, 8-hydroxy-5-quinolinesulfonic acid hydrate, and any combination thereof. Preferably, the reducing agent comprises ascorbic acid, tartaric acid, or a combination thereof. When present, the at least one reducing agent is present in the cleaning composition of the first aspect in an amount from about 0.0001 wt % to about 1 wt %, preferably about 0.0001 wt % to about 0.2 wt %, based on the total weight of the composition.

Surfactants, when present, include, but are not limited to anionic, non-ionic, cationic and/or zwitterionic surfactants, for example: alginic acid and salts thereof; carboxymethylcellulose; dextran sulfate and salts thereof; poly(galacturonic acid) and salts thereof; homopolymers of (meth)acrylic acid and salts thereof, maleic acid, maleic acid anhydride, styrene sulfonic acid and salts thereof, vinyl sulfonic acid and salts thereof, allyl sulfonic acid and salts thereof, acrylamidopropyl sulfonic acid and salts thereof; copolymers of (meth)acrylic acid and salts thereof, maleic acid, maleic acid anhydride, styrene sulfonic acid and salts thereof, vinyl sulfonic acid and salts thereof, allyl sulfonic acid and salts thereof, acrylamidopropyl sulfonic acid and salts thereof; chitosan; cationic starch; polylysine and salts thereof; homopolymers of diallyldimethyl ammonium chloride (DADMAC), diallyldimethyl ammonium bromide, diallyldimethyl ammonium sulfate, diallyldimethyl ammonium phosphates, dimethallyldimethyl ammonium chloride, diethylallyl dimethyl ammonium chloride, diallyl di(beta-hydroxyethyl) ammonium chloride, diallyl di(beta-ethoxyethyl) ammonium chloride, dimethylaminoethyl (meth)acrylate acid addition salts and quaternary salts, diethylaminoethyl (meth)acrylate acid addition salts and quaternary salts, 7-amino-3,7-dimethyloctyl (meth) acrylate acid addition salts and quaternary salts, N,N'-dimethylaminopropyl acrylamide acid addition salts and quaternary salts, allylamine, diallylamine, vinylamine, vinyl pyridine; and co-polymers of diallyldimethyl ammonium chloride (DADMAC), diallyldimethyl ammonium bromide, diallyldimethyl ammonium sulfate, diallyldimethyl ammonium phosphates, dimethallyldimethyl ammonium chloride, diethylallyl dimethyl ammonium chloride, diallyl di(beta-hydroxyethyl) ammonium chloride, diallyl di(beta-ethoxyethyl) ammonium chloride, dimethylaminoethyl (meth)acrylate acid addition salts and quaternary salts, diethylaminoethyl (meth)acrylate acid addition salts and quaternary salts, 7-amino-3,7-dimethyloctyl (meth) acrylate acid addition salts and quaternary salts, N,N'-dimethylaminopropyl acrylamide acid addition salts and quaternary salts, allylamine, diallylamine, vinylamine, vinyl pyridine; cocodimethylcarboxymethylbetaine; lauryldimethylcarboxymethylbetaine; lauryldimethyl-alpha-carboxyethylbetaine; cetyldimethylcarboxymethylbetaine; lauryl-bis-(2-hydroxyethyl)carboxymethylbetaine; stearyl-bis-(2-hydroxypropyl)carboxymethylbetaine; oleyldimethyl-gamma-carboxypropylbetaine; lauryl-bis-(2-hydroxypropyl)alpha-carboxyethylebetaine; cocodimethylsulfopropylbetaine; stearyldimethylsulfopropylbetaine; lauryl-bis-(2-hydroxyethyl)sulfopropylbetaine; sodium dodecylsulfate; dioctyl sulfosuccinate sodium salt; sodium lauryl ether sulfate; polyethylene glycol branched-nonylphenyl ether sulfate ammonium salt; disodium 2-dodecyl-3-(2-sulfonatophenoxy); PEG25-PABA; polyethylene glycol mono-C10-16-alkyl ether sulfate sodium salt; (2-N-butoxyethoxy)acetic acid; hexadecylbenzene sulfonic acid; cetyltrimethylammonium hydroxide; dodecyltrimethylammonium hydroxide; dodecyltrimethyl ammonium chloride; cetyltrimethyl ammonium chloride; N-Alkyl-N-benzyl-N, N-dimethylammonium chloride; dodecylamine; polyoxyethylene lauryl ether; dodecenylsuccinic acid monodiethanol amide; ethylenediamine tetrakis (ethoxylate-block-propoxylate); and combinations thereof. When present, the at least one surfactant is present in the cleaning composition of the first aspect in an amount from about 0.00001 wt % to about 1 wt %, preferably about 0.00001 wt % to about 0.2 wt %, based on the total weight of the composition.

When present, buffering agents are added to stabilize the cleaning composition during dilution and manufacturing as well as achieve the appropriate compositional pH, as readily determined by the skilled artisan. Buffering agents contemplated include, but are not limited to, phosphoric acid, dipotassium phosphate, potassium carbonate, boric acid, lysine, proline, β-alanine, ethylenediamine tetraacetic acid (EDTA), diethylenetriaminepentaacetic acid (DTPA), dimethyl glyoxime, dibasic phosphate salts (e.g., $(NH_4)_2HPO_4$, $K_2HPO_4$), tribasic phosphate salts (e.g., $(NH_4)_3PO_4$, $K_3PO_4$), mixtures of dibasic and tribasic phosphate salts (e.g., $K_2HPO_4/K_3PO_4$), mixtures of dibasic and tribasic carbonate salts (e.g., $K_2CO_3/KHCO_3$), hydroxyethylidene diphosphonic acid (HEDP), and combinations thereof. Preferred buffering agents, when present, include phosphoric acid, potassium carbonate, and combinations thereof. When present, the at least one buffering agent is present in the cleaning composition of the first aspect in an amount from about 0.0001 wt % to about 20 wt %, preferably about 1 to about 20 wt %, or about 1 to about 10 wt %, or about 0.1 to about 5 wt %, based on the total weight of the composition.

In a particularly preferred embodiment, the cleaning composition of the first aspect comprises, consists of, or consists essentially of at least one organic amine, water, at least one organic additive, at least one metal corrosion inhibitor, and at least one of choline hydroxide and alkali metal hydroxide, wherein the cleaning composition is formulated in the following weight percent ratios: organic amine(s)/metal corrosion inhibitor(s) in a range from about 1 to about 100, preferably about 5 to about 50, more preferably about 10 to about 25, and most preferably about 12 to about 20; choline hydroxide/metal corrosion inhibitor(s) in a range from about 0.01 to about 25, preferably about 0.1 to about 15, more preferably about 1 to about 10, and most preferably about 1 to about 6; alkali metal hydroxide(s)/metal corrosion inhibitor(s) in a range from about 0.01 to about 30, preferably about 0.5 to about 20, more preferably about 2 to about 10, and most preferably about 2 to about 6; and organic additive(s)/metal corrosion inhibitor(s) in a range from about 0.01 to about 50, preferably about 0.1 to about 25, more preferably about 1 to about 15, and most preferably about 2 to about 10. The amount of water in the cleaning composition, based on the total weight of the composition, is at least 80 wt %, preferably at least 85 wt %, and more preferably at least 90 wt %. Preferably, both the choline hydroxide and an alkali metal hydroxide are present and the at least one alkali metal hydroxide comprises KOH. Surprisingly, the best results included the combination of (a) oxalic acid and cysteine as metal corrosion inhibitors, in a weight percent ratio of about 1:1 to about 3:1, or (b) histidine, oxalic acid and cysteine as metal corrosion inhibitors, in a weight percent ratio of about 1:1:1 to about 2:3:1, based on the total weight of the composition.

In another preferred embodiment, the cleaning composition of the first aspect comprises, consists of or consists essentially of at least one organic amine, water, at least one pH adjusting agent, phosphonic acid or derivative thereof, at least one glycol ether, and at least one metal corrosion inhibitor, wherein the cleaning composition is formulated in the following weight percent ratios: organic amine(s)/metal corrosion inhibitor(s) in a range from about 1 to about 100, preferably about 5 to about 50, more preferably about 10 to about 25, and most preferably about 12 to about 20; pH adjusting agent(s)/metal corrosion inhibitor(s) in a range from about 0.1 to about 50, preferably about 1 to about 30, more preferably about 2 to about 20, and most preferably about 4 to about 10; phosphonic acid or derivative thereof/ metal corrosion inhibitor(s) in a range from about 0.01 to about 25, preferably about 0.1 to about 15, more preferably about 0.5 to about 10, and most preferably about 0.5 to about 4; and glycol ether(s)/metal corrosion inhibitor(s) in a range from about 0.01 to about 25, preferably about 0.1 to about 20, more preferably about 0.5 to about 10, and most preferably about 1 to about 6. The amount of water in the cleaning composition, based on the total weight of the composition, is at least 80 wt %, preferably at least 85 wt %, and more preferably at least 90 wt %. Preferably the phosphonic acid or derivative thereof comprises HEDP and that at least one glycol ether comprises triethylene glycol monobutyl ether or propylene glycol n-butyl ether or propylene glycol phenyl ether. Surprisingly, the best results included the combination of (a) oxalic acid and cysteine as metal corrosion inhibitors, in a weight percent ratio of about 1:1 to about 3:1, or (b) histidine, oxalic acid and cysteine as metal corrosion inhibitors, in a weight percent ratio of about 1:1:1 to about 2:3:1, based on the total weight of the composition.

In yet another embodiment, the cleaning composition of the first aspect comprises, consists of or consists essentially of at least one organic amine, water, phosphonic acid or derivative thereof, at least one glycol ether, at least one metal corrosion inhibitor, and at least one of choline hydroxide and alkali metal hydroxide, wherein the cleaning composition is formulated in the following weight percent ratios: organic amine(s)/metal corrosion inhibitor(s) in a range from about 1 to about 100, preferably about 5 to about 50, more preferably about 10 to about 25, and most preferably about 12 to about 20; choline hydroxide/metal corrosion inhibitor (s) in a range from about 0.01 to about 25, preferably about 0.1 to about 15, more preferably about 1 to about 10, and most preferably about 1 to about 6; alkali metal hydroxide(s)/metal corrosion inhibitor(s) in a range from about 0.01 to about 30, preferably about 0.5 to about 20, more preferably about 2 to about 10, and most preferably about 2 to about 6; phosphonic acid or derivative thereof/ metal corrosion inhibitor(s) in a range from about 0.01 to about 25, preferably about 0.1 to about 15, more preferably about 0.5 to about 10, and most preferably about 0.5 to about 4; and glycol ether(s)/metal corrosion inhibitor(s) in a range from about 0.01 to about 25, preferably about 0.1 to about 20, more preferably about 0.5 to about 10, and most preferably about 1 to about 6. The amount of water in the cleaning composition, based on the total weight of the composition, is at least 80 wt %, preferably at least 85 wt %, and more preferably at least 90 wt %. Preferably, both the choline hydroxide and an alkali metal hydroxide are present and the at least one alkali metal hydroxide comprises KOH, the phosphonic acid or derivative thereof comprises HEDP, and that at least one glycol ether comprises triethylene glycol monobutyl ether or propylene glycol n-butyl ether or propylene glycol phenyl ether. Surprisingly, the best results included the combination of (a) oxalic acid and cysteine as metal corrosion inhibitors, in a weight percent ratio of about 1:1 to about 3:1, or (b) histidine, oxalic acid and cysteine as metal corrosion inhibitors, in a weight percent ratio of about 1:1:1 to about 2:3:1, based on the total weight of the composition.

In still another embodiment, the cleaning composition of the first aspect comprises, consists of or consists essentially of at least one organic amine, water, at least one glycol ether, at least one buffering agent, at least one metal corrosion inhibitor, and at least one of choline hydroxide and alkali metal hydroxide, wherein the cleaning composition is formulated in the following weight percent ratios: organic amine(s)/metal corrosion inhibitor(s) in a range from about 1 to about 100, preferably about 5 to about 50, more preferably about 10 to about 25, and most preferably about 12 to about 20; choline hydroxide/metal corrosion inhibitor(s) in a range from about 0.01 to about 25, preferably about 0.1 to about 15, more preferably about 1 to about 10, and most preferably about 1 to about 6; alkali metal hydroxide(s)/metal corrosion inhibitor(s) in a range from about 0.01 to about 50, preferably about 0.5 to about 30, more preferably about 2 to about 20, and most preferably about 5 to about 15 glycol ether(s)/metal corrosion inhibitor(s) in a range from about 0.01 to about 25, preferably about 0.1 to about 20, more preferably about 0.5 to about 10, and most preferably about 1 to about 6; and buffering agent(s)/metal corrosion inhibitor(s) in a range from about 0.01 to about 25, preferably about 0.1 to about 15, more preferably about 0.5 to about 10, and most preferably about 1 to about 8. The amount of water in the cleaning composition, based on the total weight of the composition, is at least 80 wt %, preferably at least 85 wt %. Preferably, both the choline hydroxide and an alkali metal hydroxide are present and the at least one alkali metal hydroxide comprises KOH, the at least one glycol ether comprises triethylene glycol monobutyl ether or propylene glycol n-butyl ether or propylene glycol phenyl ether, and the at least one buffering agent comprises phosphoric acid or potassium carbonate. Surprisingly, the best results included the combination of (a) oxalic acid and cysteine as metal corrosion inhibitors, in a weight percent ratio of about 1:1 to about 3:1, or (b) histidine, oxalic acid and cysteine as metal corrosion inhibitors, in a weight percent ratio of about 1:1:1 to about 2:3:1, based on the total weight of the composition.

In yet another embodiment, the cleaning composition of the first aspect comprises, consists of or consists essentially of at least one organic amine, water, phosphonic acid or derivative thereof, at least one glycol ether, at least one buffering agent, at least one metal corrosion inhibitor, and at least one of choline hydroxide and alkali metal hydroxide, wherein the cleaning composition is formulated in the following weight percent ratios: organic amine(s)/metal corrosion inhibitor(s) in a range from about 1 to about 100, preferably about 5 to about 50, more preferably about 10 to about 25, and most preferably about 12 to about 20; choline hydroxide/metal corrosion inhibitor(s) in a range from about 0.01 to about 25, preferably about 0.1 to about 15, more preferably about 1 to about 10, and most preferably about 1 to about 6; alkali metal hydroxide(s)/metal corrosion inhibitor(s) in a range from about 0.01 to about 30, preferably about 0.5 to about 20, more preferably about 2 to about 10, and most preferably about 2 to about 6; phosphonic acid or derivative thereof/metal corrosion inhibitor(s) in a range from about 0.01 to about 25, preferably about 0.05 to about 15, more preferably about 0.1 to about 10, and most preferably about 0.1 to about 4; glycol ether(s)/metal corrosion inhibitor(s) in a range from about 0.01 to about 25, preferably about 0.1 to about 20, more preferably about 0.5 to about 10, and most preferably about 1 to about 6, and buffering agent(s)/metal corrosion inhibitor(s) in a range from about 1 to about 100, preferably about 5 to about 60, more preferably about 10 to about 50, and most preferably about 20 to about 40. The amount of water in the cleaning composition, based on the total weight of the composition, is at least 80 wt. Preferably, both the choline hydroxide and an alkali metal hydroxide are present and the at least one alkali metal hydroxide comprises KOH, the phosphonic acid or derivative thereof comprises HEDP, the at least one buffering agent comprises phosphoric acid or potassium carbonate, and that at least one glycol ether comprises triethylene glycol monobutyl ether or propylene glycol n-butyl ether or propylene glycol phenyl ether. Surprisingly, the best results included the combination of (a) oxalic acid and cysteine as metal corrosion inhibitors, in a weight percent ratio of about 1:1 to about 3:1, or (b) histidine, oxalic acid and cysteine as metal corrosion inhibitors, in a weight percent ratio of about 1:1:1 to about 2:3:1, based on the total weight of the composition.

The range of weight percent ratios of the components will cover all possible concentrated or diluted embodiments of the compositions of the first aspect. Towards that end, in one embodiment, a concentrated cleaning composition is provided that can be diluted for use as a cleaning solution. A concentrated cleaning composition, or "concentrate," advantageously permits a user, e.g. CMP process engineer, to dilute the concentrate to the desired strength and pH at the point of use. Dilution of the concentrated cleaning composition may be in a range from about 1:1 to about 2500:1, preferably about 10:1 to about 200:1, and most preferably about 30:1 to about 150:1, wherein the cleaning composition is diluted at or just before the tool with solvent, e.g., deionized water. It is to be appreciated by one skilled in the art that following dilution, the range of weight percent ratios of the components disclosed herein should remain unchanged.

The pH of the a concentrate of the cleaning composition of the first aspect is greater than 7, preferably in a range from about 10 to greater than 14, more preferably in a range from about 12 to about 14, and most preferably in a range from about 13 to 14. It is understood by the person skilled in the art that upon dilution, the pH of the cleaning composition will decrease to a range of about 10 to about 12.

The compositions of the first aspect may have utility in applications including, but not limited to, post-etch residue removal, post-ash residue removal surface preparation, post-plating cleaning and post-CMP residue removal. In addition, it is contemplated that the cleaning compositions may be useful for the cleaning and protection of other metal (e.g., copper-containing) products including, but not limited to, decorative metals, metal wire bonding, printed circuit boards and other electronic packaging using metal or metal alloys.

In yet another preferred embodiment, the cleaning compositions of the first aspect further include residue and/or contaminants. The residue and contaminants may be dissolved in the compositions. Alternatively, the residue and contaminants may be suspended in the compositions. Preferably, the residue includes post-CMP residue, post-etch residue, post-ash residue, contaminants, or combinations thereof.

The cleaning compositions described herein are easily formulated by simple addition of the respective ingredients and mixing to homogeneous condition. Furthermore, the compositions may be readily formulated as single-package formulations or multi-part formulations that are mixed at or before the point of use, e.g., the individual parts of the multi-part formulation may be mixed at the tool or in a storage tank upstream of the tool. The concentrations of the respective ingredients may be widely varied in specific multiples of the composition, i.e., more dilute or more concentrated, and it will be appreciated that the compositions described herein can variously and alternatively comprise, consist or consist essentially of any combination of ingredients consistent with the disclosure herein.

Accordingly, another aspect relates to a kit including, in one or more containers, one or more components adapted to form the cleaning compositions described herein. The kit may include, in one or more containers, at least one organic amine, water, at least one pH adjusting agent, at least one organic additive, and at least one metal corrosion inhibitor, for combining with more water at the fab or the point of use. In another embodiment, the kit may include, in one or more containers, at least one organic amine, at least one pH adjusting agent, at least one organic additive, and at least one metal corrosion inhibitor, for combining with water at the fab or the point of use. The containers of the kit must be suitable for storing and shipping said cleaning compositions, for example, NOWPak® containers (Entegris, Inc., Billerica, Mass., USA).

As applied to microelectronic manufacturing operations, the cleaning compositions described herein are usefully employed to clean post-CMP residue and/or contaminants, or post-etch residue or post-ash residue, from the surface of the microelectronic device. The cleaning compositions do not substantially damage low-k dielectric materials, barrier layer materials (e.g., at least one of ruthenium-containing materials, tantalum containing materials, and cobalt-containing materials), or corrode metal interconnects, e.g., copper, on the device surface. Preferably the cleaning compositions remove at least 90% of the residue present on the device prior to residue removal, more preferably at least 95%, even more preferably at least 98%, and most preferably at least 99%.

In post-CMP residue and contaminant cleaning application, the cleaning compositions described herein may be used with a large variety of conventional cleaning tools such as megasonics and brush scrubbing, including, but not limited to, Verteq single wafer megasonic Goldfinger, OnTrak systems DDS (double-sided scrubbers), SEZ or other single wafer spray rinse, Applied Materials Mirra-Mesa™/Reflexion™/Reflexion LK™, and Megasonic batch wet bench systems.

In use of the compositions for cleaning post-CMP residue, post-etch residue, post-ash residue and/or contaminants from microelectronic devices having same thereon, the cleaning composition typically is contacted with the device for a time of from about 5 sec to about 10 minutes, preferably about 1 sec to 20 min, preferably about 15 sec to about 5 min at temperature in a range of from about 20° C. to about 90° C., preferably about 20° C. to about 50° C. Such contacting times and temperatures are illustrative, and any other suitable time and temperature conditions may be employed that are efficacious to at least partially clean the post-CMP residue/contaminants from the device, within the broad practice of the method. "At least partially clean" and "substantial removal" both correspond to at removal of at least 90% of the residue present on the device prior to residue removal, more preferably at least 95%, even more preferably at least 98%, and most preferred at least 99%

Following the achievement of the desired cleaning action, the cleaning compositions may be readily removed from the device to which it has previously been applied, as may be desired and efficacious in a given end use application of the compositions described herein. Preferably, the rinse solution includes deionized water. Thereafter, the device may be dried using nitrogen or a spin-dry cycle.

Yet another aspect relates to the improved microelectronic devices made according to the methods described herein and to products containing such microelectronic devices.

Another aspect relates to a recycled cleaning composition, wherein the cleaning composition may be recycled until residue and/or contaminant loading reaches the maximum amount the cleaning composition may accommodate, as readily determined by one skilled in the art.

A still further aspect relates to methods of manufacturing an article comprising a microelectronic device, said method comprising contacting the microelectronic device with a cleaning composition for sufficient time to clean post-CMP residue and contaminants from the microelectronic device having said residue and contaminants thereon, and incorporating said microelectronic device into said article, using a cleaning composition comprising, consisting of, or consisting essentially of at least one organic amine, water, at least one pH adjusting agent, at least one organic additive, at least one metal corrosion inhibitor, optionally at least one buffering agent, and optionally at least one reducing agent.

In another aspect, a method of removing post-CMP residue and contaminants from a microelectronic device having same thereon is described, said method comprising:
  polishing the microelectronic device with a CMP slurry;
  contacting the microelectronic device with a cleaning composition described herein for a sufficient time to remove post-CMP residue and contaminants from the microelectronic device to form a post-CMP residue-containing composition; and
  continuously contacting the microelectronic device with a cleaning composition for a sufficient amount of time to effect substantial cleaning of the microelectronic device, wherein the cleaning composition comprises, consists of, or consists essentially of at least one organic amine, water, at least one pH adjusting agent, at least one organic additive, at least one metal corrosion inhibitor, optionally at least one buffering agent, and optionally at least one reducing agent.

Another aspect relates to an article of manufacture comprising a cleaning composition, a microelectronic device, and material selected from the group consisting of residue, contaminants and combinations thereof, wherein the cleaning composition comprises at least one organic amine, water, at least one pH adjusting agent, at least one organic additive, at least one metal corrosion inhibitor, optionally at least one buffering agent, and optionally at least one reducing agent, and the residue comprises at least one of post-CMP residue, post-etch residue and post-ash residue. In a preferred embodiment, the microelectronic device comprises copper, low-k dielectric material, and barrier material comprising at least one of ruthenium-containing material, tantalum-containing material, and cobalt-containing material.

The features and advantages of the invention are more fully illustrated by the following non-limiting examples, wherein all parts and percentages are by weight, unless otherwise expressly stated.

Example 1

The following solutions shown in Table 1 were prepared and were diluted 60:1 with deionized water before experimentation. Formulation A included 0.05 wt % cysteine, 0.16 wt % choline hydroxide, 4.5 wt % MEA, balance water. Formulations B-L included 0.2 wt % oxalic acid, 0.1 wt % cysteine, 4.950 wt % MEA, a mixture of choline hydroxide and KOH to produce a pH of 13.2 in the formulation, and the remaining components listed in Table 1. The solutions were tested to determine BTA removal efficiency (in percent) and copper etch rate (in A/min), the results of which are provided in Table 1 as well. The BTA removal efficiency experiments were performed using copper substrates having BTA layers grown thereon. The substrates with BTA were immersed in the solutions of Table 1 at room temperature. Ellipsometry was used to determine the BTA film thickness before and after contact with the solutions. The copper etch rate experiments were also performed at room temperature using a copper substrate.

Example 2

The following solutions shown in Table 2 were prepared and were diluted 60:1 with deionized water before experimentation. Formulations AA-KK included 0.2 wt % oxalic acid, 0.075 wt % cysteine, 4.95 wt % MEA, a mixture of choline hydroxide and KOH to produce a pH of 13.2 in the formulation (except for formulation CC), and the remaining components listed in Table 2. Of note, formulation CC had a mixture of choline hydroxide and KOH to produce a pH of about 13.7. The solutions were tested to determine BTA removal efficiency (in percent), copper etch rate (in A/min), and low-k dielectric etch rate (in A/min), the results of which are shown in Table 2 as well. The BTA removal efficiency experiments were performed using copper substrates having BTA layers grown thereon. The substrates with BTA were immersed in the solutions of Table 2 at room temperature. Ellipsometry was used to determine the BTA film thickness before and after contact with the solutions. The copper etch rate and low-k dielectric etch rate experiments were also performed at room temperature using a low-k dielectric and copper substrate, respectively.

The results show that formulations CC, DD and HH had the highest BTA removal and were commensurate with the other formulations in terms of copper etch rate and low-k dielectric etch rate. Of note, formulation HH was the most effective at removing the proprietary slurry from a copper metal surface of a microelectronic substrate. Notably, formulation CC was a higher pH version of BB, and exhibited better slurry removal and a lower copper etch rate.

It is clear that the choice of organic additive, and pH, is important with regards to the removal of BTA as well as slurry removal.

TABLE 1

Formulations A-L including copper etch rates and BTA removal efficiency.

| Component (as added) | A/wt % | B/wt % | C/wt % | D/wt % | E/wt % | F/wt % | G/wt % | H/wt % | I/wt % | J/wt % | K/wt % | L/wt % |
|---|---|---|---|---|---|---|---|---|---|---|---|---|
| DI water | 95.35 | 91.765 | 91.665 | 91.565 | 91.265 | 91.265 | 91.265 | 91.265 | 91.265 | 91.265 | 91.265 | 91.265 |
| Dowanol PnB |  | 1 | 1 | 1 | 1 | 1 | 1 |  | 1 | 1 | 1 | 1 |
| PVP |  |  | 0.1 | 0.2 |  |  |  |  |  |  |  |  |
| HEDP |  |  |  |  | 0.5 |  |  | 0.5 |  |  |  |  |
| picolmic acid |  |  |  |  |  | 0.5 |  |  |  |  |  |  |
| 1,3-cyclo-pentanedione |  |  |  |  |  |  | 0.5 |  |  |  |  |  |
| Dowanol PPh |  |  |  |  |  |  |  |  | 1 |  |  |  |
| PEI |  |  |  |  |  |  |  |  |  | 0.5 |  |  |
| HEDTA |  |  |  |  |  |  |  |  |  |  | 0.5 |  |
| CDTA |  |  |  |  |  |  |  |  |  |  | 0.5 |  |
| PVA |  |  |  |  |  |  |  |  |  |  |  | 0.5 |
| Cu etch rate/ Å min$^{-1}$ | 1.18 | 2.30 |  |  | 3.02 | 2.88 | 2.59 | 3.17 | 1.40 | 8.27 | 4.59 | 1.87 |
| BTA removal efficiency (%) | 5.7 | 86.4 |  |  | 39.3 | 51.9 | 22.2 | 14.7 | 54.6 | 14.9 | 79.6 | 4.1 |

TABLE 2

Formulations AA-KK including copper etch rates, low-k dielectric etch rates (ER), and BTA removal efficiency.

| Component (as added) | AA/wt % | BB/wt % | CC/wt % | DD/wt % | EE/wt % | FF/wt % | GG/wt % | HH/wt % | II/wt % | JJ/wt % | KK/wt % |
|---|---|---|---|---|---|---|---|---|---|---|---|
| DI water | 90.092 | 89.592 | 87.391 | 89.442 | 88.912 | 89.582 | 89.362 | 89.032 | 89.482 | 89.152 | 89.682 |
| Dowanol PnB | 0.5 | 1 | 1 | | | | | | | | |
| Dowanol PPh | | | | 1.15 | | | | | | | |
| tetraglyme | | | | | 1.68 | | | | | | |
| diglyme | | | | | | 1.01 | | | | | |
| DEGBE | | | | | | | 1.23 | | | | |
| TEGBE | | | | | | | | 1.56 | | | |
| EGHE | | | | | | | | | 1.31 | | |
| DEGHE | | | | | | | | | | 1.44 | |
| sulfolane | | | | | | | | | | | 0.91 |
| Cu etch rate/ Å min$^{-1}$ | 2.45 | 2.36 | 2.14 | 2.40 | 2.15 | 1.94 | 2.23 | 2.24 | 2.28 | 2.37 | 2.25 |
| BTA removal efficiency (%) | 43.8 | 57.4 | 92.2 | 76.3 | 27.1 | 41.0 | 50.2 | 61.6 | 28.0 | 35.1 | 53.8 |
| low-k dielectric ER/Å min$^{-1}$ | 2.45 | 2.16 | 2.44 | 1.89 | 2.48 | 2.82 | −0.79 | −0.51 | 1.41 | 2.18 | 2.19 |

Example 3

The following solutions shown in Table 3 were prepared and were diluted 60:1 with deionized water before experimentation. Formulations LL-OO included 0.2 wt % oxalic acid, 0.1 wt % cysteine, 4.95 wt % MEA, a mixture of choline hydroxide and KOH to produce a pH of 13.2 in the formulation, and the remaining components listed in Table 3. The pH of the concentrates was about 13.2. The solutions were tested to determine BTA removal efficiency (in percent) and copper etch rate (in A/min), the results of which are shown in Table 3 as well. The BTA removal efficiency experiments were performed using copper substrates having BTA layers grown thereon. The substrates with BTA were immersed in the solutions of Table 3 at room temperature. Ellipsometry was used to determine the BTA film thickness before and after contact with the solutions. The copper etch rate experiments were also performed at room temperature using a copper substrate.

The results show that formulations NN and OO had the highest BTA removal and were commensurate with the other formulations in terms of copper etch rate. Of note, formulation OO was the most effective at removing the proprietary slurry from the surface of a microelectronic substrate

TABLE 3

Formulations LL-OO and copper etch rate and BTA removal efficiency.

| Component (as added) | LL/wt % | MM/wt % | NN/wt % | OO/wt % |
|---|---|---|---|---|
| DI water | 90.87 | 90.62 | 90.238 | 87.403 |
| Dowanol PnB | 1 | 1 | 1 | 1.011 |
| HEDP | 0.5 | 0.75 | 1 | |
| histidine | | | 0.132 | |
| phosphoric acid | | | | 1.517 |
| Cu etch rate/ Å min$^{-1}$ | 3.02 | 3.13 | 3.63 | 2.56 |
| BTA removal efficiency (%) | 39.3 | 58.5 | 62.3 | 77.8 |

Although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art, based on the disclosure herein. The invention therefore is to be broadly construed, as encompassing all such variations, modifications and alternative embodiments within the spirit and scope of the claims hereafter set forth.

What is claimed is:

1. A cleaning composition comprising at least one organic amine, water, at least one pH adjusting agent, at least one organic additive, and at least one metal corrosion inhibitor, wherein the at least one metal corrosion inhibitor comprises a species selected from the group consisting of acetic acid, acetone oxime, acrylic acid, adipic acid, alanine, arginine, asparagine, aspartic acid, betaine, dimethyl glyoxime, formic acid, fumaric acid, gluconic acid, glutamic acid, glutamine, glutaric acid, glyceric acid, glycerol, glycolic acid, glyoxylic acid, histidine, iminodiacetic acid, isophthalic acid, itaconic acid, lactic acid, leucine, lysine, maleic acid, maleic anhydride, malic acid, malonic acid, mandelic acid, 2,4-pentanedione, phenylacetic acid, phenylalanine, phthalic acid, proline, propionic acid, pyrocatecol, pyromellitic acid, quinic acid, serine, sorbitol, succinic acid, tartaric acid, terephthalic acid, trimellitic acid, trimesic acid, tyrosine, valine, xylitol, oxalic acid, tannic acid, picolinic acid, 1,3-cyclopentanedione, catechol, pyrogallol, resorcinol, hydroquinone, cyanuric acid, barbituric acid, 1,2-dimethylbarbituric acid, pyruvic acid, propanethiol, benzohydroxamic acids, 2,5-dicarboxypryidine, 4-(2-hydroxyethyl)morpholine (HEM), N-aminoethylpiperazine (N-AEP), ethylenediaminetetraacetic acid (EDTA), 1,2-cyclohexanediamine-N,N,N',N"-tetraacetic acid (CDTA), N-(hydroxyethyl)-ethylenediaminetriacetic acid (HEdTA), iminodiacetic acid (IDA), 2-(hydroxyethyl)iminodiacetic acid (HIDA), nitrilotriacetic acid, thiourea, 1,1,3,3-tetramethylurea, urea, urea derivatives, glycine, cysteine, glutamic acid, isoleucine, methionine, piperadine, N-(2-aminoethyl)piperadine, pyrrolidine, threonine, tryptophan, salicylic acid, p-toluenesulfonic acid, salicylhyroxyamic, 5-sulfosalicylic acid, and combinations thereof; and wherein the organic amine and the corrosion inhibitor are present in a weight percent ratio in a range of from about 1 to about 100, the pH adjusting agent and the corrosion inhibitor are present in a weight percent ratio in a range of from about 0.1 to about 50, and the organic additive and the corrosion inhibitor are present in a weight percent ratio of from about 0.01 to about 50.

2. The cleaning composition of claim 1, wherein the cleaning composition comprises the organic amine and the metal corrosion inhibitor in a weight percent ratio of from about 2 to about 20.

3. The cleaning composition of claim 1, wherein the cleaning composition comprises the pH adjusting agent and the metal corrosion inhibitor in a weight percent ratio of from about 4 to about 10.

4. The cleaning composition of claim 1, wherein the cleaning composition comprises the organic additive and the metal corrosion inhibitor in a weight percent ratio of from about 2 to about 10.

5. The cleaning composition of claim 1, wherein the at least one organic amine comprises a species having the general formula $NR^1R^2R^3$, wherein $R^1$, $R^2$ and $R^3$ may be the same as or different from one another and are selected from the group consisting of hydrogen, straight-chained or branched $C_1$-$C_6$ alkyl, straight-chained or branched $C_1$-$C_6$ alcohol, and straight chained or branched ethers.

6. The cleaning composition of claim 1, wherein the at least one organic amine comprises a species selected from the group consisting of aminoethylethanolamine, N-methylaminoethanol, aminoethoxyethanol, aminoethoxyethoxyethanol, butoxypropylamine, methoxypropylamine, butoxyisopropylamine, 2-ethylhexylisopropoxyamine, ethanolpropylamine, ethyl ethanol amine, n-hydroxyethylmorpholine, aminopropyldiethanolamine, dimethylaminoethoxyethanol, diethanolamine, N-methyldiethanolamine, monoethanolamine, triethanolamine, 1-amino-2-propanol, 3-amino-1-propanol, diisopropylamine, aminomethylpropanediol, N,N-dimethylaminomethylpropanediol, aminoethylpropanediol, N,N-dimethylaminoethylpropanediolisopropylamine, 2-amino-1-butanol, aminomethylpropanol, aminodimethylpropanol, N,N-dimethylaminomethylpropanol, isobutanolamine, diisopropanolamine, 3-amino,4-hydroxyoctane, 2-aminobutylanol, tris(hydroxymethyl)aminomethane (TRIS), N,N-dimethyltris(hydroxymethyl)aminomethane, hydroxyproplyamine, benzylamine, hydroxyethyl amine, tris(hydroxyethyl)aminomethane, triethylenediamine, tetraethylenepentamine (TEPA), triethylenetetraamine, ethylenediamine, hexamethylenediamine, diethylenetriamine, triethylamine, trimethylamine, diglycolamine; morpholine; dicyanamide; and combinations thereof.

7. The cleaning composition of claim 1, wherein the at least one organic amine comprises monoethanolamine.

8. The cleaning composition of claim 1, wherein the at least one pH adjusting agent has the formula $NR^1R^2R^3R^4OH$ or $PR^1R^2R^3R^4OH$, wherein $R^1$, $R^2$, $R^3$ and $R^4$ may be the same as or different from one another and are selected from the group consisting of hydrogen, straight-chained or branched $C_2$-$C_6$ alkyl, $C_1$-$C_6$ alkoxy, and substituted or unsubstituted $C_6$-$C_{10}$ aryl.

9. The cleaning composition of claim 1, wherein the at least one pH adjusting agent comprises a species selected from the group consisting of tetraethylammonium hydroxide (TEAH), tetrapropylammonium hydroxide (TPAH), tetrabutylammonium hydroxide (TBAH), tributylmethylammonium hydroxide (TBMAH), benzyltrimethylammonium hydroxide (BTMAH), ethyltrimethylammonium hydroxide, choline hydroxide, tris(2-hydroxyethyl)methyl ammonium hydroxide, diethyldimethylammonium hydroxide, triethylmethylammonium hydroxide, trishydroxyethylmethyl ammonium hydroxide, tetrabutylphosphonium hydroxide (TBPH), tetramethylphosphonium hydroxide, tetraethylphosphonium hydroxide, tetrapropylphosphonium hydroxide, benzyltriphenylphosphonium hydroxide, methyl triphenylphosphonium hydroxide, ethyl triphenylphosphonium hydroxide, N-propyl triphenylphosphonium hydroxide, and combinations thereof.

10. The cleaning composition of claim 1, wherein the at least one pH adjusting agent comprises choline hydroxide.

11. The cleaning composition of claim 1, wherein the at least one metal corrosion inhibitor comprises cysteine, oxalic acid, histidine, or any combination thereof.

12. The cleaning composition of claim 1, wherein the organic additive comprises a species selected from the group consisting of 2-pyrrolidinone, 1-(2-hydroxyethyl)-2-pyrrolidinone (HEP), glycerol, 1,4-butanediol, tetramethylene sulfone, dimethyl sulfone, ethylene glycol, propylene glycol, dipropylene glycol, tetraglyme, diglyme, diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether (DEGBE), triethylene glycol monobutyl ether (TEGBE), ethylene glycol monohexyl ether (EGHE), diethylene glycol monohexyl ether (DEGHE), ethylene glycol phenyl ether, propylene glycol methyl ether, dipropylene glycol methyl ether (DPGME), tripropylene glycol methyl ether (TPGME), dipropylene glycol dimethyl ether, dipropylene glycol ethyl ether, propylene glycol n-propyl ether, dipropylene glycol n-propyl ether (DPGPE), tripropylene glycol n-propyl ether, propylene glycol n-butyl ether, dipropylene glycol n-butyl ether, tripropylene glycol n-butyl ether, propylene glycol phenyl ether, phosphonic acid, 1-hydroxyethylidene-1,1-diphosphonic acid (HEDP), 1,5,9-triazacyclododecane-N,N',N"-tris(methylenephosphonic acid) (DOTRP), 1,4,7,10-tetraazacyclododecane-N,N',N",N"'-tetrakis(methylenephosphonic acid) (DOTP), nitrilotris(methylene)triphosphonic acid, diethylenetriaminepenta(methylenephosphonic acid) (DETAP), aminotri(methylenephosphonic acid), bis(hexamethylene)triamine phosphonic acid, 1,4,7-triazacyclononane-N,N',N"-tris (methylenephosphonic acid (NOTP), hydroxypropylcellulose, hydroxyethylcellulose (HEC), carboxymethylcellulose, sodium carboxymethylcellulose (Na CMC), polyvinylpyrrolidone (PVP), polyacrylic acid esters, analogoues of polyacrylic acid esters, polyalanine, polyleucine, polyglycine, polyamidohydroxyurethanes, polylactones, polyacrylamide, Xanthan gum, chitosan, polyethylene oxide, polyvinyl alcohol (PVA), polyvinyl acetate, polyacrylic acid, polyethyleneimine (PEI), sorbitol, xylitol, esters of anhydrosorbitols, secondary alcohol ethoxylates, and combinations thereof.

13. The cleaning composition of claim 12, wherein the organic additive comprises triethylene glycol monobutyl ether, propylene glycol n-butyl ether, propylene glycol phenyl ether, HEDP, HEC, or any combination thereof.

14. The cleaning composition of claim 1, wherein the cleaning composition further comprises at least one reducing agent comprising a species selected from the group consisting of ascorbic acid, L(+)-ascorbic acid, isoascorbic acid, ascorbic acid derivatives, gallic acid, formamidinesulfinic acid, uric acid, tartaric acid, cysteine, potassium D-gluconate, hydroxylamine, potassium nitrite, guanidine carbonate, 8-hydroxy-5-quinolinesulfonic acid hydrate, and any combination thereof.

15. The cleaning composition of claim 1, wherein the cleaning composition further comprises at least one buffering agent comprising a species selected from the group consisting of phosphoric acid, dipotassium phosphate, potassium carbonate, boric acid, lysine, proline, β-alanine, ethylenediamine tetraacetic acid (EDTA), diethylenetriaminepentaacetic acid (DTPA), dimethyl glyoxime, $(NH_4)_2HPO_4$, $K_2HPO_4$, $(NH_4)_3PO_4$, $K_3PO_4$, $K_2HPO_4$/$K_3PO_4$, $K_2CO_3$/$KHCO_3$, hydroxyethylidene diphosphonic acid (HEDP), and combinations thereof.

16. The cleaning composition claim 1, wherein the cleaning composition further comprises at least one surfactant selected from the group consisting of alginic acid and salts thereof; carboxymethylcellulose; dextran sulfate and salts thereof; poly(galacturonic acid) and salts thereof; homopolymers of (meth)acrylic acid and salts thereof, maleic acid, maleic acid anhydride, styrene sulfonic acid and salts thereof, vinyl sulfonic acid and salts thereof, allyl sulfonic acid and salts thereof, acrylamidopropyl sulfonic acid and salts thereof; copolymers of (meth)acrylic acid and salts thereof, maleic acid, maleic acid anhydride, styrene sulfonic acid and salts thereof, vinyl sulfonic acid and salts thereof, allyl sulfonic acid and salts thereof, acrylamidopropyl sulfonic acid and salts thereof; chitosan; cationic starch; polylysine and salts thereof; homopolymers of diallyldimethyl ammonium chloride (DADMAC), diallyldimethyl ammonium bromide, diallyldimethyl ammonium sulfate, diallyldimethyl ammonium phosphates, dimethallyldimethyl ammonium chloride, diethylallyl dimethyl ammonium chloride, diallyl di(beta-hydroxyethyl) ammonium chloride, diallyl di(beta-ethoxyethyl) ammonium chloride, dimethylaminoethyl (meth)acrylate acid addition salts and quaternary salts, diethylaminoethyl (meth)acrylate acid addition salts and quaternary salts, 7-amino-3,7-dimethyloctyl (meth) acrylate acid addition salts and quaternary salts, N,N'-dimethylaminopropyl acrylamide acid addition salts and quaternary salts, allylamine, diallylamine, vinylamine, vinyl pyridine; and co-polymers of diallyldimethyl ammonium chloride (DADMAC), diallyldimethyl ammonium bromide, diallyldimethyl ammonium sulfate, diallyldimethyl ammonium phosphates, dimethallyldimethyl ammonium chloride, diethylallyl dimethyl ammonium chloride, diallyl di(beta-hydroxyethyl) ammonium chloride, diallyl di(beta-ethoxyethyl) ammonium chloride, dimethylaminoethyl (meth)acrylate acid addition salts and quaternary salts, diethylaminoethyl (meth)acrylate acid addition salts and quaternary salts, 7-amino-3,7-dimethyloctyl (meth) acrylate acid addition salts and quaternary salts, N,N'-dimethylaminopropyl acrylamide acid addition salts and quaternary salts, allylamine, diallylamine, vinylamine, vinyl pyridine; cocodimethylcarboxymethylbetaine; lauryldimethylcarboxymethylbetaine; lauryldimethyl-alpha-carboxyethylbetaine; cetyldimethylcarboxymethylbetaine; lauryl-bis-(2-hydroxyethyl)carboxymethylbetaine; stearyl-bis-(2-hydroxypropyl)carboxymethylbetaine; oleyldimethyl-gamma-carboxypropylbetaine; lauryl-bis-(2-hydroxypropyl)alpha-carboxyethylebetaine; cocodimethylsulfopropylbetaine; stearyldimethylsulfopropylbetaine; lauryl-bis-(2-hydroxyethyl)sulfopropylbetaine; sodium dodecyl sulfate; dioctyl sulfosuccinate sodium salt; sodium lauryl ether sulfate; polyethylene glycol branched-nonylphenyl ether sulfate ammonium salt; disodium 2-dodecyl-3-(2-sulfonatophenoxy); PEG25-PABA; polyethylene glycol mono-C10-16-alkyl ether sulfate sodium salt; (2-N-butoxyethoxy)acetic acid; hexadecylbenzene sulfonic acid; cetyltrimethylammonium hydroxide; dodecyltrimethylammonium hydroxide; dodecyltrimethyl ammonium chloride; cetyltrimethyl ammonium chloride; N-Alkyl-N-benzyl-N, N-dimethylammonium chloride; dodecylamine; polyoxyethylene lauryl ether; dodecenylsuccinic acid monodiethanol amide; ethylenediamine tetrakis (ethoxylate-block-propoxylate); and combinations thereof.

17. The cleaning composition of claim 1, wherein the cleaning composition is substantially devoid of at least one oxidizing agent; fluoride-containing sources; abrasive materials; tetramethylammonium hydroxide; azole-containing corrosion inhibitors; gallic acid; sulfonium compounds; amidoxime compounds; and combinations thereof.

18. A method of removing residue and contaminants from a microelectronic device having said residue and contaminants thereon, said method comprising contacting the microelectronic device with a cleaning composition for sufficient time to at least partially clean said residue and contaminants from the microelectronic device, wherein the cleaning composition is compatible with barrier layer materials, wherein the cleaning composition comprises at least one organic amine, water, at least one pH adjusting agent, at least one organic additive, and at least one metal corrosion inhibitor,
wherein the at least one metal corrosion inhibitor comprises a species selected from the group consisting of acetic acid, acetone oxime, acrylic acid, adipic acid, alanine, arginine, asparagine, aspartic acid, betaine, dimethyl glyoxime, formic acid, fumaric acid, gluconic acid, glutamic acid, glutamine, glutaric acid, glyceric acid, glycerol, glycolic acid, glyoxylic acid, histidine, iminodiacetic acid, isophthalic acid, itaconic acid, lactic acid, leucine, lysine, maleic acid, maleic anhydride, malic acid, malonic acid, mandelic acid, 2,4-pentanedione, phenylacetic acid, phenylalanine, phthalic acid, proline, propionic acid, pyrocatecol, pyromellitic acid, quinic acid, serine, sorbitol, succinic acid, tartaric acid, terephthalic acid, trimellitic acid, trimesic acid, tyrosine, valine, xylitol, oxalic acid, tannic acid, picolinic acid,1,3-cyclopentanedione, catechol, pyrogallol, resorcinol, hydroquinone, cyanuric acid, barbituric acid, 1,2-dimethylbarbituric acid, pyruvic acid, propanethiol, benzohydroxamic acids, 2,5-dicarboxypryidine, 4-(2-hydroxyethyl)morpholine (HEM), N-aminoethylpiperazine (N-AEP), ethylenediaminetetraacetic acid (EDTA), 1,2-cyclohexanediamine-N,N,N',N"-tetraacetic acid (CDTA), N-(hydroxyethyl)-ethylenediaminetriacetic acid (HEdTA), iminodiacetic acid (IDA), 2-(hydroxyethyl)iminodiacetic acid (HIDA), nitrilotriacetic acid, thiourea, 1,1,3,3-tetramethylurea, urea, urea derivatives, glycine, cysteine, glutamic acid, isoleucine, methionine, piperadine, N-(2-aminoethyl) piperadine, pyrrolidine, threonine, tryptophan, salicylic acid, p-toluenesulfonic acid, salicylhyroxyamic, 5-sulfosalicylic acid, and combinations thereof; and
wherein the organic amine and the corrosion inhibitor are present in a weight percent ratio in a range of from about 1 to about 100, the pH adjusting agent and the corrosion inhibitor are present in a weight percent ratio in a range of from about 0.1 to about 50, and the organic additive and the corrosion inhibitor are present in a weight percent ratio of from about 0.01 to about 50.

19. The method of claim 18, wherein the contaminant is benzotriazole, and wherein the method further simultaneously lowers the corrosion rate of exposed copper and the amount of residue remaining on the exposed copper.

\* \* \* \* \*